US006782467B1

United States Patent
Rezeanu

(10) Patent No.: US 6,782,467 B1
(45) Date of Patent: Aug. 24, 2004

(54) METHOD AND APPARATUS FOR FAST LIMITED CORE AREA ACCESS AND CROSS-PORT WORD SIZE MULTIPLICATION IN SYNCHRONOUS MULTIPORT MEMORIES

(75) Inventor: Stefan-Cristian Rezeanu, Colorado Springs, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 436 days.

(21) Appl. No.: 09/895,114

(22) Filed: Jun. 29, 2001

(51) Int. Cl.[7] .............................................. G06F 12/06
(52) U.S. Cl. ....................... 711/219; 711/209; 711/217
(58) Field of Search .......................... 365/236; 711/201, 711/212, 217, 219, 209

(56) References Cited

U.S. PATENT DOCUMENTS

| | | | | |
|---|---|---|---|---|
| 4,852,049 A | * | 7/1989 | Sakai | ........................ 711/214 |
| 5,829,051 A | * | 10/1998 | Steely et al. | ................. 711/216 |
| 5,832,290 A | * | 11/1998 | Gostin et al. | ................... 712/5 |
| 5,850,368 A | * | 12/1998 | Ong et al. | ................ 365/238.5 |
| 6,166,989 A | | 12/2000 | Hamamoto et al. | .......... 365/233 |
| 6,167,487 A | | 12/2000 | Camacho et al. | ............ 711/131 |
| 6,170,034 B1 | | 1/2001 | Weston-Lewis et al. | ........ 711/4 |
| 6,175,514 B1 | | 1/2001 | Henderson et al. | ........... 365/49 |
| 6,175,534 B1 | | 1/2001 | Taniguchi et al. | ........... 365/233 |
| 6,230,250 B1 | * | 5/2001 | Vogley | ........................ 711/218 |

* cited by examiner

*Primary Examiner*—Gary Portka
(74) *Attorney, Agent, or Firm*—Christopher P. Maiorana, P.C.

(57) ABSTRACT

An apparatus comprising a control circuit and a generation circuit. The control circuit may be configured to generate a mask signal, a unique counter control signal, and an incremented state signal in response to an address signal and a counter control signal. The generation circuit may (i) comprise an internal counter register and (ii) be configured to generate an output address in response to the mask signal, the unique counter control signal, and the incremented state signal. The mask signal may be configured to selectively mask the internal counter register.

23 Claims, 3 Drawing Sheets

METHOD AND APPARATUS FOR FAST LIMITED CORE AREA ACCESS AND CROSS-PORT WORD SIZE MULTIPLICATION IN SYNCHRONOUS MULTIPORT MEMORIES

FIELD OF THE INVENTION

The present invention relates to a method and/or architecture for simultaneous cross-port word size multiplication generally and, more particularly, to a method and/or architecture for simultaneous cross-port word size multiplication and high speed cycling through core areas.

BACKGROUND OF THE INVENTION

Conventional approaches for cross-port word size multiplication use one or more of the following:

A) cross-port word size multiplication requiring active use of the address bus;

B) cycling through limited core areas requiring either active use of the address bus or special test modes; and C) flagging a wraparound or last-state-in-sequence event for limited core area cycling could be done with on-chip logic only for a predetermined limited number of core areas.

U.S. Pat. No. 6,166,989 entitled Clock Synchronous Type Semiconductor Memory Device that can switch word configuration (Hamamoto, et al.) includes a mask control circuit used to inactivate the read or write data drivers during a specific operation mode.

Typical cross-port word size multiplication schemes use cascaded counter sections to separately cycle through predetermined blocks of addresses. Typical cross-port word size multiplication schemes also implement a number of control signals in order to permanently disable one (or several) MSBs of an address counter/register, thus reducing the addressable memory size. Conventional approaches have one or more of the following disadvantages:

(A) cross-port word size multiplication could not be done by straight address incrementation or decrementation using a dedicated control pin, and as such required active use of the address bus;

(B) did not allow cycling through reduced core areas without the need for active use of the address bus or special test modes, which most often are not available to the user; and (C) reduced flexibility for isolating limited memory blocks and cycling through them without active address bus usage even using test modes.

Mask signals are used to mask data values either input to or output from the memory device, or as soon as they are read out of the memory cells. Such approaches can be found in the following U.S. Pat. No. : 6,175,534, filed Apr. 26, 1999; U.S. Pat. No. 6,175,514, filed Aug. 27, 1999; U.S. Pat. No. 6,170,034, filed Mar. 31, 1998; U.S. Pat. No. 6,167,487, filed Jan. 13, 1998; U.S. Pat. No. 6,166,989, filed Mar. 3, 1999.

U.S. Pat. No. 6,175,534 entitled Synchronous Semiconductor Storage Device (Taniguchi, et al.) uses a mask signal that can mask data values input to or output from the synchronous semiconductor storage device.

U.S. Pat. No. 6,175,514 entitled Content Addressable Memory Device (Henderson, et al.) discloses the memory device is able to activate a mask function, used in comparing/matching the outputs of two memory cells fed into a compare cell.

U.S. Pat. No. 6,170,034 entitled Hardware Assisted Mask Read/Write (WestonLewis, et al.) uses a mask bit counter which is incremented to point and allow processing of successive bits of a mask command stored in a mask word register.

U.S. Pat. No. 6,167,487 entitled Multiport RAM Having Functionally Identical Ports (Camacho, et al.) makes use of a pair of mask control signals for performing byte masking of the input data.

SUMMARY OF THE INVENTION

The present invention concerns an apparatus comprising a control circuit and a generation circuit. The control circuit may be configured to generate a mask signal, a unique counter control signal, and an incremented state signal in response to an address signal and a counter control signal. The generation circuit may (i) comprise an internal counter register and (ii) be configured to generate an output address in response to the mask signal, the unique counter control signal, and the incremented state signal. The mask signal may be configured to selectively mask the internal counter register.

The objects, features and advantages of the present invention include providing a method and apparatus for fast limited core area access and cross-port word size multiplication in synchronous multiport memories that may (i) implement a special-definition mask register associated with a mask-controlled incrementer/decrementer in order to restrict counter rank manipulation, (ii) selectively mask an internal address counter register, (iii) allow a number of features without active use of the address bus (during normal operation or silicon debug phase), (iv) provide high speed cycling through a limited memory area, (v) group ports to allow simultaneous fast access from one or more microprocessors, and/or (vi) address counter wraparound or last-state-in-sequence flagging.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
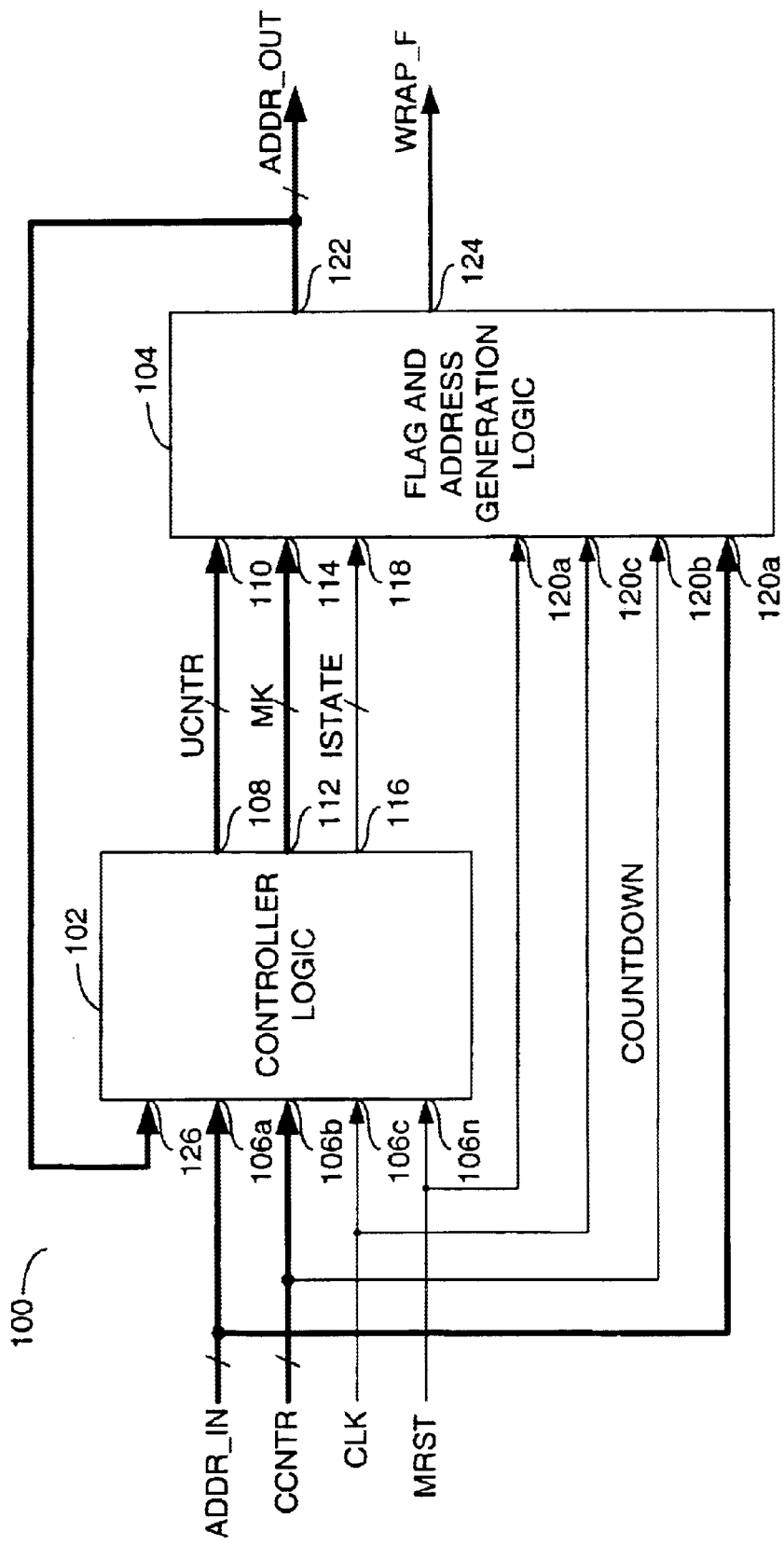
FIG. 1 is a block diagram of a preferred embodiment of the present invention.

Referring to FIG. 1, a block diagram of a circuit 100 is shown in accordance with a preferred embodiment of the present invention. The circuit 100 may provide selective masking of an internal address counter register (to be discussed in connection with FIGS. 2 and 3). The circuit 100 may not implement active use of an address bus during normal operation (or silicon debug phase) to allow availability of one or more of the following features (i) high speed cycling through a limited memory area, (ii) grouping of I/O ports to allow simultaneous fast access from one or more microprocessors, (iii) manipulating word formats in multiples of an internal multiport SRAM word format, and/or (iv) providing address counter wraparound or last-state-in-sequence flagging, applied to an active region.

The circuit 100 generally comprises a control logic block (or circuit) 102 and a flag and address generation logic block (or circuit) 104. The control logic circuit 102 may have a number of inputs 106a–106n that may receive a number of signals (e.g., ADDR_IN, CCNTR, CLK and MRST). The signal CCNTR may be implemented as a multi-bit counter control bus. The signal ADDR_IN may be implemented as a multi-bit address bus. The control circuit 102 may also have an output 108 that may present a signal (e.g., UCNTR) to an input 110 of the generation circuit 104, an output 112 that may present a signal (e.g., MK) to an input 114 of the generation circuit 104 and an output 116 that may present a signal (e.g., ISTATE) to an input 118 of the generation circuit 104. The signal UCNTR may be implemented as a multi-bit unique control bus, with only one (or a limited count) of the control bits active at a given time. The signal MK may be implemented as a multi-bit mask control bus. The signal ISTATE may be implemented as a multi-bit increment state bus.

The generation circuit 104 may have a number of inputs 120a–120n that may receive the signals ADDR_IN, CLK, MRST and a signal (e.g., COUNTDOWN) derived from the signal CCNTR. The generation circuit 104 may have an output 122 that may present a signal (e.g., ADDR_OUT) and an output 124 that may present a signal or flag (e.g., WRAP_F). The signal ADDR_OUT may be implemented as a multi-bit,output address bus. The signal ADDR_OUT may represent a present state of the circuit 100. The signal ADDR_OUT (e.g., a present state of the circuit 100) may be presented to an input 126 of control circuit 102 as a feedback signal. The signal WRAP_F may be implemented as a wraparound (or last-state-in-sequence) flag.

Figure 2:
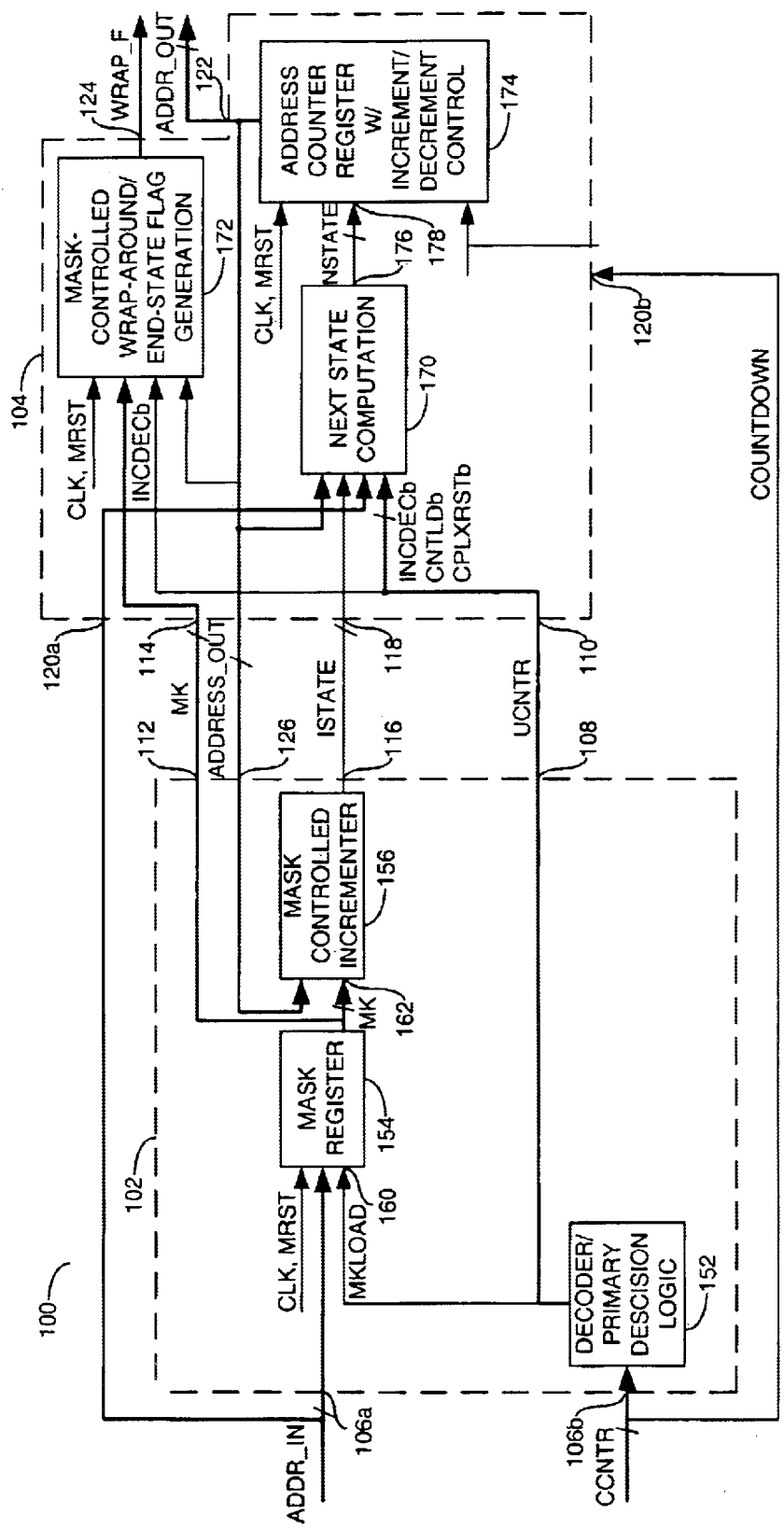
FIG. 2 is a more detailed block diagram of the circuit of FIG. 1.

Referring to FIG. 2, the circuit 102 is shown comprising a block (or circuit) 152, a block (or circuit) 154 and a block (or circuit) 156. The circuit 152 may be implemented as a decoder/priority decision logic block. The circuit 154 may be implemented as a mask register block. The circuit 156 may be implemented as a mask-controlled incrementer.

The circuit 152 may receive the counter control signal CCNTR. The circuit 152 may have an output 158 that may present the control signal UCNTR. The control signal UCNTR may have a unique one (or a unique limited number) of the control bits active at a given time. A mask load signal (e.g., MKLOAD) may be derived from the control signal UCNTR. The mask load signal MKLOAD may be presented to an input 160 of the mask register 154. The circuit 154 may receive the address ADDR_IN, the clock signal CLK and the master reset signal MRST. The register 154 may also have an output that may present the mask signal MK to an input 162 of the circuit 156. A full-mask flag signal (e.g., FULLMK, not shown) may indicate that all the counter bits are to be masked and may be part of the signal MK. The circuit 156 may receive the feedback signal ADDR_OUT. The circuit 156 may also present the signal ISTATE.

The circuit 104 is shown comprising a block (or circuit) 170, a block (or circuit) 172 and a block (or circuit) 174. The circuit 170 may be implemented as a next-state computation block. The circuit 172 may be implemented as a mask-controlled wrap-around/end-state flag generator. The circuit 174 may be implemented as a address counter register with increment/decrement control.

The circuit 170 may receive the signals ADDR_OUT, ISTATE, ADDR_IN, and a set of uniquely decoded counter control signals (e.g., INCDECb, CNTLDb and CPLXRSTb). The signal CNTLDb may be a control signal controlling a counter load operation. The signal CPLXRSTb may be a complex combination of the signal CCNTR (e.g., a complex reset). The circuit 170 may have an output 176 that may present a signal (e.g., NSTATE). The signal NSTATE may be implemented as a multi-bit bus. The circuit 172 may receive the signals CLK, MRST, MK, INCDECb and ADDR_OUT. The circuit 172 may also generate the wraparound (or last-state-in-sequence) flag WRAP_F. The circuit 174 may have an input 178 that may receive the signal NSTATE. The circuit 174 may also receive the signals CLK, MRST and COUNTDOWN (component control bit of the signal CCNTR). The circuit 174 may generate the signal ADDR_OUT.

When the CNTRSTb control bit (component of the signal CCNTR) is active, the signal CPLXRSTb may also be active, and a counter reset operation may occur (e.g., a parallel load of 00 . . . 00 into the counter 174). The signal CPLXRSTb may also be active if the signal MKLDb may be inactive and either the signal CNTLDb or the signal INCDECb may be active. In this case, the activation of the signal CPLXRSTb may prevent a counter hold operation by preventing the parallel loading of the present state (via the address signal ADDR_OUT), while either the external address ADDR_OUT or the incremented state ISTATE may become the next state NSTATE and be parallel loaded into the counter 174.

When the signal CPLXRSTb is inactive a parallel loading of the counter 174 with the present state (via the signal ADDR_OUT) may occur. The present state ADDR_OUT may then become the next state NSTATE during a counter hold condition. Such a parallel load may occur if either (i) the signal MKLDb is active (indicating a mask load operation), or (ii) neither the signal CNTLDb nor the signal INCDECb is active.

The incrementer 156 may be controlled by the mask signal MK. The inctementer 156 may shift down the bits of a present state via the signal ADDR_OUT with the number of masked LSBs in the input stage of the incrementer block 156 (such that the first unmasked bit in the bits ADDR_OUT of the counter 174 starting from the LSB is routed to a LSB of the binary incrementer block (not shown, within the mask-controlled incrementer block 156). The increment signal ISTATE may correspond to a shift up operation complementary to the shift down operation described above. Thus, the incremented (unmasked) bits may be routed back to their proper rank.

The signal UCNTR may be implemented as a set of unique operation counter control signals. In this case, only a single control signal or a limited number of control signals (e.g., the CPLXRSTb signal in conjunction with another counter control signal) may be active during any particular cycle.

An example (but not limited to) operation of the various signals of the present invention is shown in the following TABLE 1, where CNT refers to the counter/address register, MK refers to the mask register, and ADDR refers to the external address ADDR_IN:

TABLE 1

| CLK | MRSTb | CNTRSTb | MKLOADb | CNTLDb | INCDECb | Operation |
|---|---|---|---|---|---|---|
| X   | L | X | X | X | X | CNT reset and MK set |
| L-H | H | L | X | X | X | CNT reset |
| L-H | H | H | L | X | X | Load ADDR into MK |
| L-H | H | H | H | L | X | Load ADDR into CNT |
| L-H | H | H | H | H | L | CNT increment/decrement |
| L-H | H | H | H | H | H | CNT hold |

The counter-incrementer loop (e.g., the incrementer 156, the next state computation 170 and the address counter 174) may execute incrementations, the decrementing case being taken care of in the counter register when the countdown control signal COUNTDOWN is active (e.g., by routing out the complemented outputs).

The counter 174 may be parallel loaded with the computed next state NSTATE at the transition of the clock CLK, in accordance with the specific operation the counter control signal CCNTR may indicate. For example, the uniquely decoded signal UCNTR may indicate one of the following operations: a counter reset, a mask load, a counter load, a counter increment, counter hold, etc.

For an increment only implementation, the wraparound flag WRAP_F may be activated for one cycle after an active clock transition of the signal CLK finds the unmasked bits in the last-in-sequence. state (11 ... 11) and the counter increment control signal (via the signal INCDECb, component of the signal UCNTR) is active, while the fullmask flag FULLMK (part of the signal MK, not shown) is inactive. A last-state-in-sequence flag and/or wraparound flag for a transition event from any other desired intermediate state of the active counter 174 may be a subset-function, implemented similarly to the above-described flag WRAP_F. The flag may only implement a similar "triggering state" detector for the desired state/transaction to be flagged.

Figure 3:
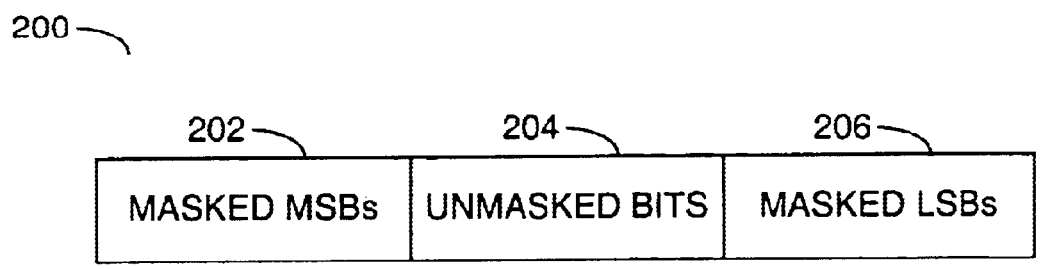
FIG. 3 is a diagram illustrating the mask bits.

Referring to FIG. 3, an example counter register 200 is shown making use of a special definition mask register associated with a mask-controlled incrementer/decrementer. The register 200 may restrict the counter bit manipulation to a middle region. The address counter register 200 may implement selective mask-controlled incrementation/decrementation by allowing contiguous masking on both most significant bits (MSBS) and least significant bits (LSBs).

The counter register may comprise three contiguous regions 202, 204, and 206 (each of them possibly having a 0-bit-dimension). A Mask Register content example may be ((0 ... 0) (1 ... 1) (0 ... 0), where 0 designates a masked bit and each of the three regions may extend from zero bits to the full bitlength of the counter. Such an example may provide (i) masking of a contiguous block of MSBs allowing limited core area access, (ii) unmasking a contiguous middle-bit block allowing cycling through specific limited core areas by incrementing/decrementing the resulting variable-dimension counter (dimension given by the number of unmasked bits), and (iii) masking of a contiguous block of LSBs allowing cross-port word size multiplication.

The masking technique of the present invention may allow (i) any two ports with a mask on LSB addresses to be combined to operate as a double word-size single port, where the LSBs of the two port counters were initially loaded with a 1 and a 0, respectively. For example, the present invention may allow the configuration of a x18 Quad Port memory such that the memory may operate as a x36 Dual Port memory. However, all four ports with a mask on two LSBs may be combined to allow the original x18 Quad Port to operate as a x72 single port, where the two LSBs of the four (different port) counters were initially loaded with (1,1), (1,0), (0,1), and (0,0), respectively.

For limited core area cycling, the address allocation may allow the MSBs to be assigned to the group/block addresses, followed by columns, and then the row addresses as LSBs. The circuit 100 may provide cross-port word size multiplication. In one example, for no LSBs masked, the cross-port word-size multiplication is invalidated, the circuit being used as a quad port with each port operating with a x18 word format, which may be the width of the internal data bus.

Alternate embodiments of the circuit 100 may provide higher operation speed. However, higher speed embodiments may implement additional circuitry. For example, the circuit 100 may implement an additional incrementer/decrementer or multiple instances thereof depending on the possible order of multiplicity of the internal word size (e.g., translated in number of allowable masked LSBs).

The propagation delay through an input shift-down routing stage (not shown) of the mask-controlled incrementer 156 may be eliminated by using direct routing to several incrementers. For example, the mask signal MK may control the multiple incrementer blocks within the mask-controlled incrementer block 156. The incrementer blocks within the block 156 may be designed to increment starting with a different rank (e.g., a first particular incrementer may start with the LSB, a second particular incrementer may keep the LSB unchanged and start incrementing beginning with LSB+1). In general the necessary number of incrementers is one more than the number of LSBs which may be masked. For example, for a quad port 18-bit memory when no LSB is masked, a "increment_from_rank_0" incrementer may be selected. An equivalent dual port 36-bit memory may be obtained by masking the LSB on all four ports after loading the LSBs of each pair of ports with a 0 and a 1, respectively. The two LSBs of the mask may then select the "increment_from_rank_1" incrementer. Similarly, by masking the two LSBs after loading the four counters with 00, 01, 10, and 11 on those ranks, an equivalent 72-bit single port memory may be obtained (e.g., a maximum cross-port size multiplication) and then the third incrementer ("increment_from_rank_2") may be the one selected by the two LSBs of the mask.

The circuit 100 may thus provide a minimum address counter cycle time, at the expense of the additional hardware. Additionally, the number of incrementers may be implemented to match a number of decrementers.

Limited core area cycling using the circuit 100 may be accomplished through straight counter address register incrementation or decrementation using a dedicated control pin. Therefore, the circuit 100 may allow cycling through reduced core areas without the need for active use of the address bus or special test modes. The circuit 100 may allow a wraparound (or last-state-in-sequence event) flagging, in the case of limited core area cycling, to be accomplished automatically with onchip logic. The circuit 100 may also allow easier debug of a memory device during the qualification phase, by allowing flexible reduced core area cycling.

The circuit 100 may provide selective masking of the internal address counter register 174 to allow (i) high speed cycling through limited memory areas, the limited area cycling may be accomplished by activating the counter-increment/decrement control INCDECb input at each active transition of the clock, (ii) grouping of memory ports to allow simultaneous fast access from one or more microprocessors manipulating larger word formats, (iii) freeing up of an external address bus, that may be controlled by external devices (not shown) after an initial mask and counter parallel loading, and (iv) address counter wraparound (or last-state-in-sequence event) flagging applied to active mask-controlled regions.

The circuit 100 may allow the decoder/priority decision logic block 152 to generate a set of unique operation counter control signals UCNTR, where a single counter control signal or a limited number of counter control signals may be active during any particular cycle. The circuit 100 may shift down (input) and up (output) the allowed to be incremented/decremented block of bits in the mask-controlled incrementer 156. The circuit 100 may allow the flag generator circuit 172 to generate the wraparound or end-state flag WRAP_F (e.g., last-state-in-sequence=max or min, for incrementation or decrementation), based on the transition/state of exclusively the unmasked bits, in the proximity of the max/min state (1 ... 1/0 ... 0) only as long as the counter 156 is not fully masked.

The circuit 100 may allow the address ADDR_IN and the control signal CCNTR to be preprocessed in the decoder/priority decision logic block 152 and next state computation block 170. Therefore, the address ADDR_OUT may be rapidly released to the memory array from the address counter register 174 as soon as the active transition and the clock CLK is received. Due to the above-mentioned preprocessing of the counter control signal CCNTR and/or the presence of the mask-controlled incrementer 156, operations such as counter reset or increment/decrement may be converted to a fast parallel load operation at the arrival of the active clock transition.

The circuit 100 may provide higher operating speeds, achieved by using multiple mask-controlled start_at_fixed_rank incrementers. For example, the circuit 100 may be implemented using multiple incrementers (e.g., one more than the maximum number of LSBs expected to be masked for cross-port size multiplication purposes). Therefore, the higher operating speeds may be achieved by making use of the incrementer/decrementer block(s) instead of controlling the incrementation/decrementation in the address counter register 174.

The various signal of the present invention may be implemented as single-bit or multi-bit signals in a serial and/or parallel configuration.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a control circuit configured to generate (i) a control signal in response to a counter control signal and (ii) an increment signal by masking an output address signal in response to both an input address signal and said control signal; and
    a generation circuit configured to generate said output address in response to both said increment signal and said control signal.

2. The apparatus according to claim 1, wherein said output address signal is configured to provide cycling through limited memory areas.

3. The apparatus according to claim 1, wherein said apparatus forms part of a multiport memory.

4. The apparatus according to claim 3, wherein said apparatus is configured to group a plurality of ports of said multiport memory to operate as a single port.

5. The apparatus according to claim 4, wherein said apparatus is further configured to allow access to a memory from one or more microprocessors using word formats that are a multiple of an internal memory word format of said memory.

6. The apparatus according to claim 1, wherein said apparatus is configured to free an external address bus and allow an external device to control said external address bus after an initial masking.

7. The apparatus according to claim 1, wherein said generation circuit comprises an internal counter register configured to (i) be parallel loaded with information based on said input address signal, (ii) hold a present state and (iii) increment/decrement at each transition of a clock signal.

8. The apparatus according to claim 1, wherein said generation circuit comprises a flag generator circuit configured to generate a flag signal to indicate a wrap around of said output address signal within an address range defined by a plurality of unmasked bits for said output address signal.

9. The apparatus according to claim 1, wherein said control circuit comprises
    a decoder/priority decision circuit configured to generate a mask load signal in response to said counter control signal.

10. The apparatus according to claim 1, wherein said control circuit comprises a decoder/priority decision circuit configured to generate a mask load signal as a portion of said control signal to enable generation of a mask signal.

11. The apparatus according to claim 1, wherein said generation circuit comprises:
    an internal counter register configured to generate said output address signal;
    a next state computation circuit configured to generate a next state signal in response to (a) said input address signal, (b) said output address signal, (c) said increment signal and (d) said control signal; and
    a flag generation circuit configured to generate a flag signal indicative of a transition condition of an unmasked region of the said internal counter register.

12. The apparatus according to claim 11, wherein:
    said next state computation circuit is further configured to be controlled by a first portion of said control signal; and
    said flag generation circuit is further configured to generate said flag signal in response to (a) a portion of said output address signal, (b) a mask signal generated by said control circuit and (c) a second portion of said control signal; and
    said internal counter register is further configured to (i) parallel-load the said next state signal and (ii) generate said output address signal either in true or complement logic state in response to a countdown signal.

13. The apparatus according to claim 1, wherein said control signal comprises one or more signals selected from the group consisting of (i) increment signals, (ii) decrement signals, (iii) increment/decrement signals, (iv) counter load signals, (v) complex reset signals and (vi) mask load signals.

14. An apparatus comprising:

means for generating (i) a control signal in response to a counter control signal and (ii) an increment signal by masking an output address signal in response to both an input address signal and said control signal; and means for generating said output address signal in response to both said increment signal and said control signal.

15. A method for limited core area access and cross-port word size multiplication, comprising the steps of:

(A) generating a control signal in response to a counter control signal;

(B) generating an increment signal by selectively masking an output address signal in response to both an input address signal and said control signal; and (C) generating said output address signal in response to both said increment signal and said control signal.

16. The method according to claim 15, wherein said output address signal provides cycling through limited memory areas.

17. The method according to claim 15, wherein step (B) further comprises:

allowing simultaneous access of a multiport memory.

18. The method according to claim 15, wherein step (B) further comprises:

allowing an external device to control an address bus after an initial masking.

19. The method according to claim 15, wherein step (C) further comprises:

(i) parallel loading when in a first state, (ii) holding when in a second state and (iii) incrementing/decrementing when in a third state at each active transition of a clock signal.

20. The method according to claim 15, further comprising the step of:

generating a flag signal to indicate a wrap around of said output address signal within an address range defined by a plurality of unmasked bits for said output address signal.

21. The apparatus according to claim 9, wherein said control circuit further comprises a mask register configured to generate a mask signal by loading an address from said input address signal in response to said mask load signal.

22. The apparatus according to claim 21, wherein said control circuit further comprises a mask controlled incrementer configured to generate said increment signal in response to both said mask signal and said output address signal.

23. The apparatus according to claim 21, wherein said mask signal comprises a full-mask signal to indicate masking of all bits.

* * * * *